United States Patent
Park

(10) Patent No.: US 7,874,171 B2
(45) Date of Patent: Jan. 25, 2011

(54) AIR CONDITIONER FOR COMMUNICATION EQUIPMENT AND CONTROLLING METHOD THEREOF

(75) Inventor: Hee Tae Park, Seoul (KR)

(73) Assignee: Chang Jo 21 Co., Ltd., Gyeonggi-Do (KR)

( * ) Notice: Subject to any disclaimer, the term of this patent is extended or adjusted under 35 U.S.C. 154(b) by 534 days.

(21) Appl. No.: 11/816,892

(22) PCT Filed: Jul. 6, 2005

(86) PCT No.: PCT/KR2005/002165

§ 371 (c)(1),
(2), (4) Date: Jun. 9, 2008

(87) PCT Pub. No.: WO2006/112570

PCT Pub. Date: Oct. 26, 2006

(65) Prior Publication Data

US 2009/0019874 A1 Jan. 22, 2009

(30) Foreign Application Priority Data

Feb. 23, 2005 (KR) ................... 10-2005-0014790

(51) Int. Cl.
*F25D 17/02* (2006.01)
*F25B 41/00* (2006.01)
*F25B 25/00* (2006.01)

(52) U.S. Cl. .................... 62/185; 62/201; 62/203; 62/259.2; 62/332

(58) Field of Classification Search ............ 62/175, 62/185, 201, 203, 259.2, 332

See application file for complete search history.

(56) References Cited

U.S. PATENT DOCUMENTS

| 5,142,883 | A  | * | 9/1992 | DeWitt ...................... 62/298 |
| 5,709,100 | A  | * | 1/1998 | Baer et al. ................. 62/259.2 |
| 6,615,603 | B2 | * | 9/2003 | Tanaka et al. ............. 62/259.2 |
| 7,165,412 | B1 | * | 1/2007 | Bean, Jr. ................... 62/259.2 |
| 7,418,825 | B1 | * | 9/2008 | Bean, Jr. ................... 62/259.2 |
| 2008/0250807 | A1 | * | 10/2008 | Park ......................... 62/259.2 |

FOREIGN PATENT DOCUMENTS

| JP | 08-014676 | 1/1996 |
| JP | 10-205832 | 8/1998 |
| KR | 20-0255162 | 11/2001 |
| KR | 20-0273591 | 4/2002 |
| KR | 10-2004-0008302 | 1/2004 |

\* cited by examiner

*Primary Examiner*—Marc E Norman
(74) *Attorney, Agent, or Firm*—Rabin & Berdo, P.C.

(57) ABSTRACT

An air conditioner for communication equipment according to the present invention comprises an indoor module located inside a base station, and having a storage tank in which cooling water is stored, a pair of circulation pumps which are installed in parallel on a cooling water pipe extending from an outlet of the storage tank, an indoor heat exchanger which is installed on the cooling water pipe extending from outlets of the circulation pumps, and an indoor blower which is positioned adjacent to the indoor heat exchanger; and an outdoor module located outside the base station, and having an outdoor heat exchanger which is installed on the cooling water pipe extending from an outlet of the indoor heat exchanger, an outdoor blower which is positioned adjacent to the outdoor heat exchanger, and a pair of cooling units which are installed in series on the cooling water pipe extending from an outlet of the outdoor heat exchanger.

7 Claims, 3 Drawing Sheets

【Figure 1】
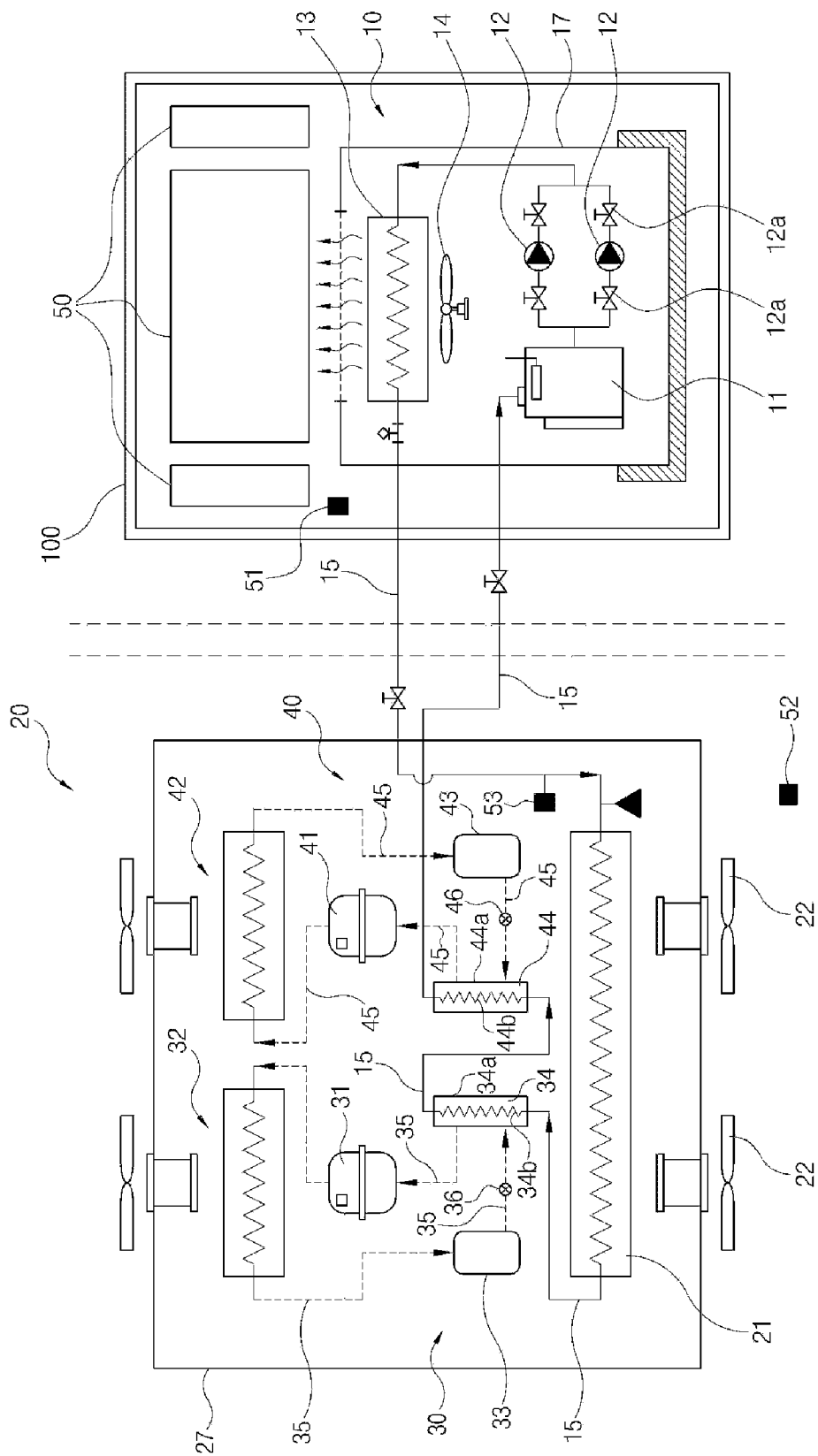

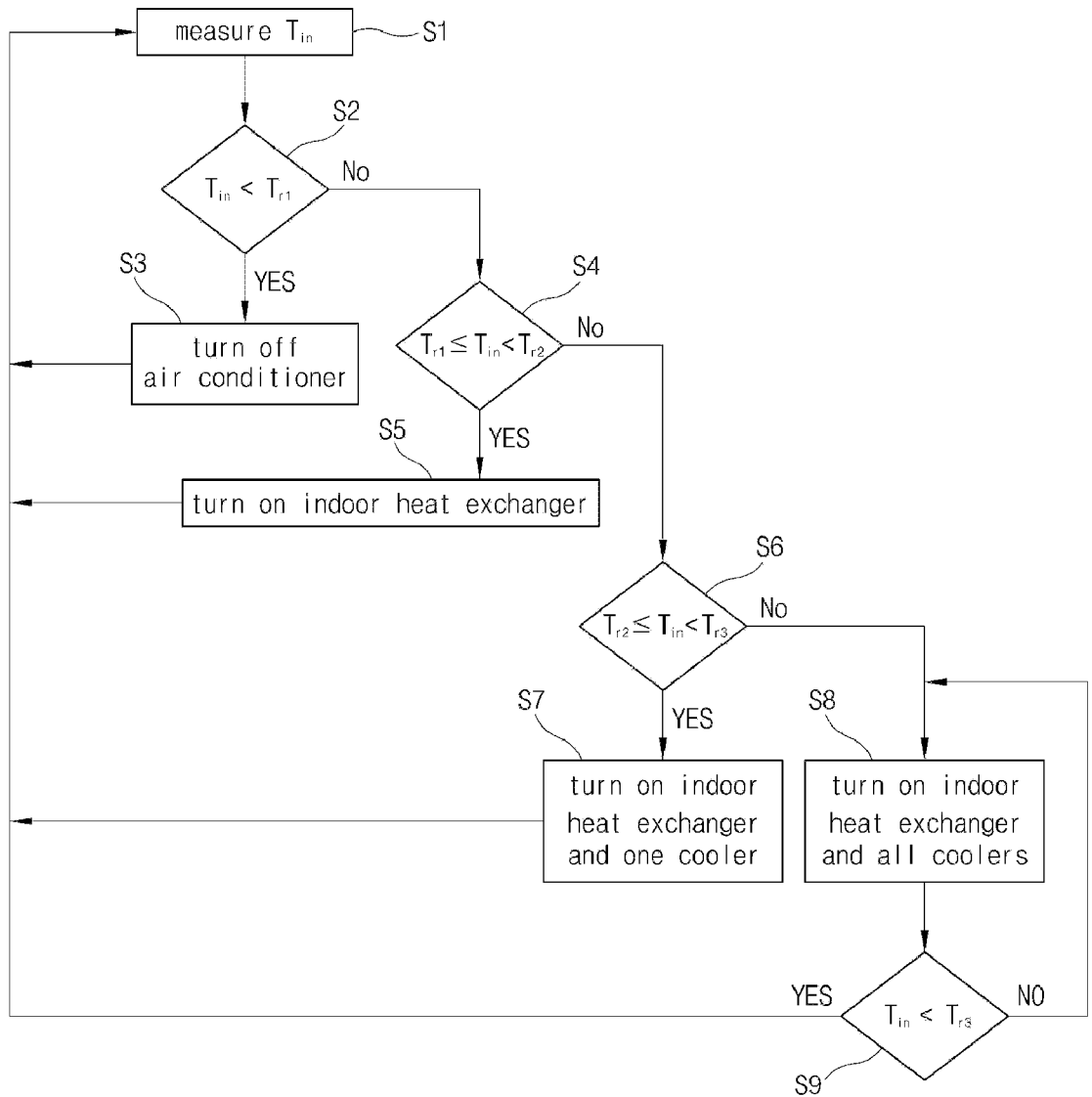
[Figure 2]

[Figure 3]
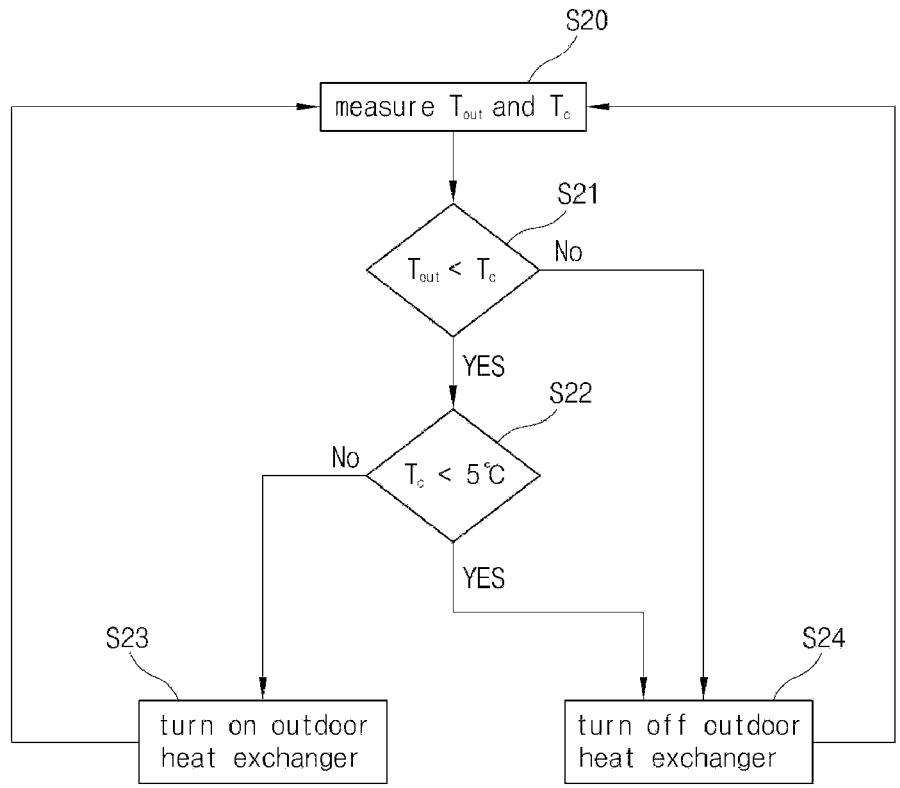
[Figure 4]
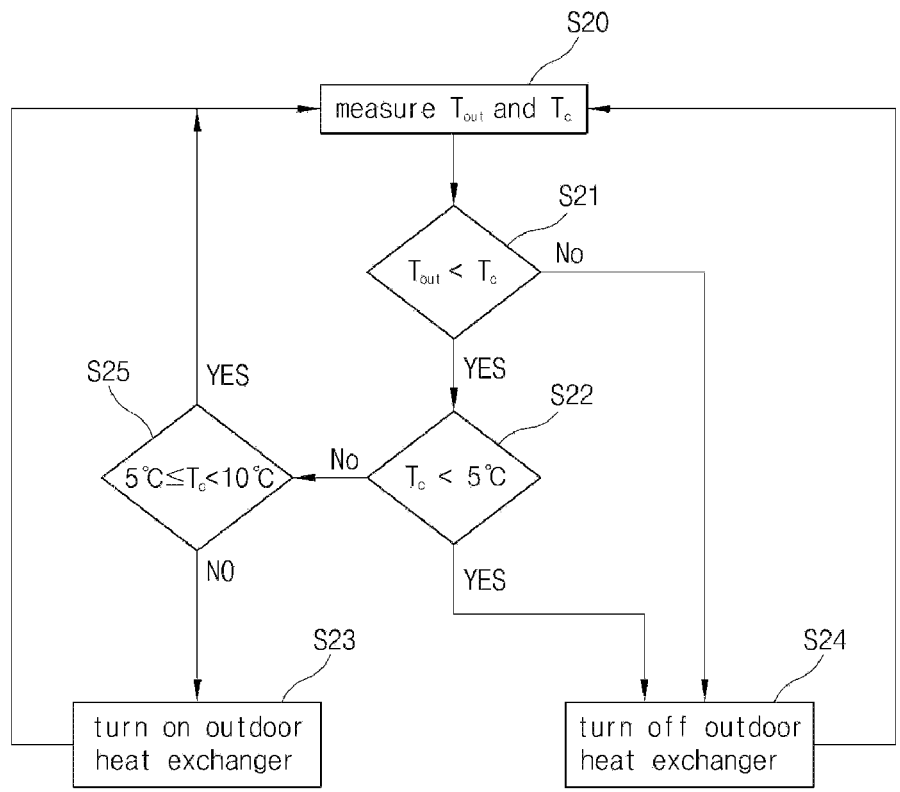

AIR CONDITIONER FOR COMMUNICATION EQUIPMENT AND CONTROLLING METHOD THEREOF

TECHNICAL FIELD

The present invention relates to an air conditioner, and more particularly to an air conditioner for communication equipment which is arranged inside a base station, a booth, etc. to cool communication equipment disposed therein, thereby preventing malfunction of the communication equipment due to heat generation and ensuring stable operation of the communication equipment, and a control method thereof.

BACKGROUND ART

As is generally known in the art, a conventional air conditioner employs evaporation heat which a refrigerant absorbs from surroundings when it evaporates. Typically, as the refrigerant, liquids such as ammonia, Freon, an azeotropic refrigerant mixture, chloromethyl, or the like, are used.

In the conventional air conditioner, as a vaporized refrigerant compressed by a compressor at high pressure passes through a condenser, the refrigerant exchanges heat with outside air and condenses to a liquid refrigerant at high pressure. The liquid refrigerant at high pressure is then turned into a low pressure liquid refrigerant after passing through an expansion valve, a capillary tube, or the like. Thereupon, the low pressure liquid refrigerant enters an evaporator, exchanges heat with inside air, and evaporates. Next, the evaporated low pressure refrigerant enters the compressor to complete an air conditioning cycle which is continuously repeated. The air cooled by the evaporation heat absorbed by the refrigerant in the evaporator is directed by a blower fan into a space or toward a target object to perform a cooling function.

Therefore, the conventional air conditioner uses a refrigerant the phase of which can be easily changed, that is, can be easily condensed and evaporated, to cool the space or target object.

Generally, in the case of a base communication station or a communication-equipped car, various wired or wireless communication equipment is installed. This communication equipment is likely to have loose connections or to break down due to constant generation of heat, whereby malfunction of the communication equipment may result. For this reason, it is necessary to cool the communication equipment all year round to minimize malfunction of the communication equipment due to heat generated therein.

However, in the conventional air conditioner for communication equipment, since naturally cold outside temperatures are not appropriately used and the air conditioner is only driven through the use of electric power, electric power consumption is increased.

Also, the refrigerants used in the conventional air conditioner for communication equipment are expensive and have been found to cause environmental pollution.

In consideration of these facts, in an effort to solve the above-described problems, the present applicant has disclosed Korean Patent Application No. 2002-41905 entitled "Multi-use air conditioner and control method thereof".

Nevertheless, in this type of air conditioner, if one of the component elements breaks down, because the operation of the entire air conditioner is interrupted, the space cannot be maintained in a cooled state for the time during which the operation of the communication equipment is interrupted.

DISCLOSURE

Technical Problem

Accordingly, the present invention has been made keeping in mind the above problems occurring in the prior art, and an object of the present invention is to provide an air conditioner for communication equipment which employs naturally cold outside temperatures to minimize electric power consumption and to maximize cooling efficiency, and which uses a relatively cheap refrigerant in order to minimize the maintenance cost, and a control method thereof.

Another object of the present invention is to provide an air conditioner for communication equipment which adopts a double cooling water circulation structure and a double outdoor heat exchange structure, thereby maintaining the communication equipment in a cooled state at all times, and a control method thereof.

Technical Solution

In order to achieve the above objects, according to one aspect of the present invention, there is provided an air conditioner for communication equipment comprising:

an indoor module located inside a base station in which communication equipment is installed, and having a storage tank in which cooling water is stored, a pair of circulation pumps which are installed in parallel on a cooling water pipe extending from an outlet of the storage tank to circulate cooling water in the storage tank, an indoor heat exchanger which is installed on the cooling water pipe extending from outlets of the pair of circulation pumps, and an indoor blower which is positioned adjacent to the indoor heat exchanger; and an outdoor module located outside the base station, and having an outdoor heat exchanger which is installed on the cooling water pipe extending from an outlet of the indoor heat exchanger, an outdoor blower which is positioned adjacent to the outdoor heat exchanger, and a pair of cooling units which are installed in series on the cooling water pipe extending from an outlet of the outdoor heat exchanger, wherein each cooling unit of the outdoor module includes a compressor for compressing a refrigerant used in the cooling unit, a condenser which communicates with the compressor through a refrigerant pipe, a receiver dryer which communicates with the condenser through the refrigerant pipe, a heat exchanger through which a heat exchange tube communicating with the cooling water pipe passes, and an expansion valve which is installed on the refrigerant pipe between the receiver dryer and the heat exchanger.

According to another aspect of the present invention, an indoor temperature sensor is installed inside the base station, an outdoor temperature sensor is installed outside the base station, and a cooling water temperature sensor is installed on the cooling water pipe at the threshold of the outdoor module.

According to still another aspect of the present invention, there is provided a method for controlling an air conditioner for communication equipment, divided into a method for controlling the indoor heat exchanger and the cooling units and a method for controlling the outdoor heat exchanger, the method for controlling the indoor heat exchanger and the cooling units comprising:

a first step of measuring an indoor temperature using the indoor temperature sensor;

a second step of determining whether the indoor temperature is lower than a first reference temperature, and turning off the entire air conditioner when the indoor temperature is lower than the first reference temperature or turning on the indoor heat exchanger when the indoor temperature is higher than or equal to the first reference temperature;

a third step of determining whether the indoor temperature is higher than or equal to the first reference temperature and is lower than a second reference temperature, and returning to the first step when the indoor temperature is higher than or equal to the first reference temperature and is lower than a second reference temperature or turning on one of the first and second cooling units and the indoor heat exchanger when the indoor temperature is higher than or equal to the second reference temperature;

a fourth step of determining whether the indoor temperature is higher than or equal to the second reference temperature and is lower than a third reference temperature, and returning to the first step when the indoor temperature is higher than or equal to the second reference temperature and is lower than a third reference temperature;

a fifth step of turning on both first and second cooling units and the indoor heat exchanger when the indoor temperature is higher than or equal to the third reference temperature; and a sixth step of determining whether the indoor temperature is lower than the third reference temperature, and returning to the first step when the indoor temperature is lower than the third reference temperature or returning to the fifth step when the indoor temperature is higher than or equal to the third reference temperature, and the method for controlling the outdoor heat exchanger comprising:

a first step of separately measuring an outdoor temperature and a cooling water temperature respectively using the outdoor temperature sensor and the cooling water temperature sensor;

a second step of determining whether the outdoor temperature is lower than the cooling water temperature;

a third step of turning on the outdoor heat exchanger when the outdoor temperature is lower than the cooling water temperature; and a fourth step of turning off the outdoor heat exchanger when the outdoor temperature is higher than or equal to the cooling water temperature.

According to yet still another aspect of the present invention, the method for controlling the outdoor heat exchanger further comprises the step of, after the second step, determining whether the cooling water temperature is lower than 5☐, and turning off the outdoor heat exchanger when the cooling water temperature is lower than 5☐ or turning on the outdoor heat exchanger when the cooling water temperature is higher than or equal to 5☐.

ADVANTAGEOUS EFFECTS

Thanks to the features of the present invention, advantages are provided in that naturally cold outside temperatures are employed to minimize electric power consumption and maximize cooling efficiency, and a relatively cheap refrigerant is used to minimize the maintenance cost.

Further, in the present invention, since a double cooling water circulation structure and a double outdoor heat exchanging structure are adopted, it is possible to maintain the communication equipment in a cooled state at all times.

DESCRIPTION OF DRAWINGS

FIG. 1 is a schematic structural view illustrating an air conditioner for communication equipment in accordance with an embodiment of the present invention;

FIG. 2 is a flow chart illustrating a method for controlling an indoor heat exchanger and cooling units in the air conditioner for communication equipment in accordance with the embodiment of the present invention;

FIG. 3 is a flow chart illustrating a method for controlling an outdoor heat exchanger in the air conditioner for communication equipment in accordance with the embodiment of the present invention; and FIG. 4 is a flow chart illustrating another method for controlling the outdoor heat exchanger in the air conditioner for communication equipment in accordance with the embodiment of the present invention.

BEST MODE

Hereafter, a preferred embodiment of the present invention will be described in detail with reference to the attached drawings.

*38 FIG. 1 is a schematic structural view illustrating an air conditioner for communication equipment in accordance with an embodiment of the present invention.

As shown in the drawing, the air conditioner for communication equipment in accordance with the embodiment of the present invention includes an indoor module 10 which is located inside a base station 100, and an outdoor module 20 which is located outside the base station 100.

The indoor module 10 comprises a storage tank 11 in which cooling water is stored, a pair of circulation pumps 12 which are installed on the cooling water pipe extending from the outlet of the storage tank 11, an indoor heat exchanger 13 which is installed on the cooling water pipe extending from the outlets of the pair of circulation pumps 12, and an indoor blower 14 which is positioned adjacent to the indoor heat exchanger 13.

A substance which serves as a refrigerant in the air conditioner according to the present invention is stored in the storage tank 11, and preferably comprises a liquid substance such as cooling water which does not need to undergo a phase change.

Preferably, the inner and outer surfaces of the storage tank 11 are formed of an insulating material so that heat is not discharged to or absorbed from the outside.

Due to the fact that cooling water serving as the refrigerant in the present invention does not need to undergo a phase change and can be easily obtained from the surrounding environment, economy and environmental friendliness are ensured.

The pair of circulation pumps 12 are installed in parallel on the cooling water pipe which extends from the outlet of the storage tank 11 to circulate cooling water stored in the storage tank 11.

First and second flow control valves 12a and 12b are installed on the inlet and outlet sides of the respective circulation pumps 12 to appropriately regulate the amounts of cooling water introduced into and discharged from the storage tank 11.

As described above, in the present invention, due to the fact that a double cooling water circulation structure, in which the pair of circulation pumps 12 are installed in parallel on the cooling water pipe, is adopted, even when one circulation pump 12 does not work, the other circulation pump 12 can properly operate, whereby the cooled state of the communication equipment installed in the base station 100 can be reliably maintained.

The indoor heat exchanger 13 is installed on a portion of the cooling water pipe 15 that extends from the outlets of the pair of circulation pumps 12.

The indoor blower 14 is positioned adjacent to the heat transfer surface of the indoor heat exchanger 13 on which heat transfer occurs, and is structured so that air cooled by the heat exchanging function of the indoor heat exchanger 13 can be blown toward the communication equipment 50.

The indoor blower 14 functions to increase contact and heat exchange efficiency between the indoor heat exchanger 13 and indoor air.

The indoor module 10 constructed as mentioned above can be integrally configured in a module case 17 as shown in FIG. 1.

The indoor heat exchanger 13 is located adjacent to the communication equipment 50 in the base station or a booth 100. The storage tank 11 and the circulation pumps 12 can be installed inside or outside the base station or the booth 100 in consideration of the on-the-spot conditions at the location of the base station or the booth 100, an installation condition, etc. such as the size of the base station or the booth 100, and the location of the communication equipment 50 to be cooled.

The outdoor module 20 comprises an outdoor heat exchanger 21 which is located outside the base station 100, outdoor blowers 22 which are positioned adjacent to the outdoor heat exchanger 21, and a pair of cooling units 30 and 40 which are installed in series on the cooling water pipe 15 extending from the outlet of the outdoor heat exchanger 21.

The outdoor heat exchanger 21 is installed on a portion of the cooling water pipe 15 which extends from the outlet of the indoor heat exchanger 13.

The outdoor blowers 22 are positioned adjacent to the heat transfer surface of the outdoor heat exchanger 21 at which heat transfer occurs, and function to increase contact and heat exchange efficiency between the outdoor heat exchanger 21 and outdoor air.

The first and second cooling units 30 and 40 are installed in series on the portion of the cooling water pipe 15 that extends from the outlet of the outdoor heat exchanger 21. The first and second cooling units 30 and 40 comprise compressors 31 and 41 for compressing a refrigerant used in the cooling units, condensers 32 and 42 which communicate with the compressors 31 and 41 through refrigerant pipes 35 and 45, receiver dryers 33 and 43 which communicate with the condensers 32 and 42 through the refrigerant pipes 35 and 45, heat exchangers 34 and 44 through which heat exchange tubes 34b and 44b pass, and expansion valves 36 and 46 which are installed on the refrigerant pipes 35 and 45 between the receiver dryers 33 and 43 and the heat exchangers 34 and 44. The refrigerant used in the cooling units 30 and 40 is a conventional one such as ammonia, Freon, an azeotropic refrigerant mixture, chloromethyl, or the like.

The compressors 31 and 41 are conventional compressors for compressing a vaporized refrigerant to high pressure.

The condensers 32 and 42 serve as a kind of heat exchanger for condensing the refrigerant which is discharged from the compressors 31 and 41.

The receiver dryers 33 and 43 temporarily store the liquid refrigerant having high pressure, which is discharged from the condensers 32 and 42, and remove moisture and dust contained in the refrigerant.

The heat exchangers 34 and 44 comprise cases 34a and 44a and the heat exchange tubes 34b and 44b. The heat exchange tubes 34b and 44b of the first and second cooling units 30 and 40 are installed in series on the cooling water pipe 15. First ends of the respective cases 34a and 44a are respectively connected by the refrigerant pipes 35 and 45 which communicate with the compressors 31 and 41, and second ends of the respective cases 34a and 44a are respectively connected by the refrigerant pipes 35 and 45 which communicate with the receiver dryers 33 and 43, so that the refrigerant can be introduced into and discharged from the cases 34a and 44a.

The expansion valves 36 and 46 quickly expand the liquid refrigerant which has high pressure and is discharged from the receiver dryers 33 and 43, and convert it into a refrigerant having high temperature and low pressure.

Thanks to the structures of the cooling units 30 and 40 as mentioned above, the refrigerant circulated through the refrigerant pipes 35 and 45 of the cooling units 30 and 40 is compressed by the compressors 31 and 41 to high pressure, and is condensed by the condensers 32 and 42. Then, the refrigerant is introduced into the cases 34a and 44a of the heat exchangers 34 and 44 and exchanges heat with the cooling water which flows through the heat exchange tubes 34b and 44b of the heat exchangers 34 and 44. Due to this heat exchanging function, the refrigerant evaporates, and the cooling water is cooled to a desired temperature.

As described above, in the present invention, due to the fact that the double outdoor heat exchange structure, in which the pair of cooling units 30 and 40 are installed in series on the outdoor portion of the cooling water pipe 15, is adopted, even when one of the cooling units 30 and 40 does not work, the other of the cooling units 30 and 40 can properly operate, whereby the cooled state of the cooling water can be reliably maintained.

The outdoor module 20 constructed as mentioned above can be integrally configured in a module case 27 as shown in FIG. 1.

Preferably, in the multi-use air conditioner according to the present invention, in order to effectively control the air conditioning function thereof, an indoor temperature sensor 51 is installed inside the base station 100, an outdoor temperature sensor 52 is installed outside the base station 100, and a cooling water temperature sensor 53 is installed on the cooling water pipe 15 adjacent to the outdoor heat exchanger 21.

By comparing the temperatures sensed by the respective indoor temperature sensor, outdoor temperature sensor and cooling water temperature sensor 51, 52 and 53 with reference temperatures, the indoor heat exchanger 13, the outdoor heat exchanger 21 and the cooling units 30 and 40 are selectively driven to cool the space inside the base station 100.

FIGS. 2 and 3 are flow charts illustrating an air conditioning method according to the present invention.

FIG. 2 illustrates a method for controlling the indoor heat exchanger 13 and the cooling units 30 and 40 in the air conditioner for communication equipment in accordance with the embodiment of the present invention.

First, the indoor temperature $T_{in}$ is measured using the indoor temperature sensor 51 (S1).

It is determined whether the indoor temperature $T_{in}$ is lower than a first reference temperature $T_{r1}$ (S2). If the indoor temperature $T_{in}$ is lower than the first reference temperature $T_{r1}$, the entire air conditioner is turned off (S3).

Then, it is determined whether the indoor temperature $T_{in}$ is higher than or equal to the first reference temperature $T_{r1}$ and lower than a second reference temperature $T_{r2}$ (S4), and if the indoor temperature $T_{in}$ is higher than or equal to the first reference temperature $T_{r1}$ and lower than a second reference temperature $T_{r2}$, the indoor heat exchanger 13 is turned on (S5).

Next, it is determined whether the indoor temperature $T_{in}$ is higher than or equal to the second reference temperature $T_{r2}$ and lower than a third reference temperature $T_{r3}$ (S6). If the indoor temperature $T_{in}$ is higher than or equal to the second reference temperature $T_{r2}$ and lower than a third reference temperature $T_{r3}$, one of the first and second cooling units 30 and 40 and the indoor heat exchanger 13 are turned on (S7), and if the indoor temperature $T_{in}$ is higher than or equal to the third reference temperature $T_{r3}$, both first and second cooling units 30 and 40 and the indoor heat exchanger 13 are turned on (S8).

Thereafter, it is determined whether the indoor temperature $T_{in}$ is lower than the third reference temperature $T_{r3}$ (S9). If the indoor temperature $T_{in}$ is lower than the third reference temperature $T_{r3}$, the method returns to step S1, and if the indoor temperature $T_{in}$ is higher than or equal to the third reference temperature $T_{r3}$, the method returns to step S8.

At steps S3, S5, S7 and S9, the method can return to step S1 depending upon the indoor temperature $T_{in}$ to repeat their respective preceding steps to thereby respond in real time to temperature changes inside the base station 100 due to the operation of the air conditioner according to the present invention.

FIG. 3 is a flow chart illustrating a method for controlling the outdoor heat exchanger 21 in the air conditioner for communication equipment in accordance with the embodiment of the present invention.

While the method for controlling the indoor heat exchanger 13 and the cooling units 30 and 40 is implemented depending upon the indoor temperature $T_{in}$, the method for controlling the outdoor heat exchanger 21 is implemented depending upon the outdoor temperature $T_{out}$ and the cooling water temperature $T_c$. In other words, the method for controlling the outdoor heat exchanger 21 is implemented independently of the method for controlling the indoor heat exchanger 13 and the cooling units 30 and 40.

First, the outdoor temperature $T_{out}$ of the base station 100 and the cooling water temperature $T_c$ are separately measured using the outdoor temperature sensor 52 and the cooling water temperature sensor 53, respectively (S20).

Then, it is determined whether the outdoor temperature $T_{out}$ is lower than the cooling water temperature $T_c$ (S21). If the outdoor temperature $T_{out}$ is lower than the cooling water temperature $T_c$, the outdoor heat exchanger 21 is turned on (S23), and if the outdoor temperature $T_{out}$ is higher than or equal to the cooling water temperature $T_c$, the outdoor heat exchanger 21 is turned off (S24).

At steps S23 and S24, the method can return to step S20 to repeat respective preceding steps and to thereby respond in real time to temperature changes outside the base station 100.

Preferably, after step S21, the method for controlling the outdoor heat exchanger 21 further comprises step S22. In step S22, whether the cooling water temperature $T_c$ is lower than 5☐ is determined. If the cooling water temperature $T_c$ is lower than 5☐, the outdoor heat exchanger 21 is turned off, and if the cooling water temperature $T_c$ is higher than or equal to 5☐, the outdoor heat exchanger 21 is turned on.

In step S22, in the case that the cooling water temperature $T_c$ is lower than 5☐, the outdoor heat exchanger 21 is automatically turned off so as to prevent cooling water from being excessively cooled and the cooling water pipe 15 from being frozen and broken due to low indoor temperatures in the wintertime.

Alternatively, as shown in FIG. 4, after step S21, whether the cooling water temperature $T_c$ is lower than 5☐ is determined. If the cooling water temperature $T_c$ is lower than 5☐, the outdoor heat exchanger 21 is turned off (S22). If the cooling water temperature $T_c$ is higher than or equal to 5☐ and is lower than 10☐, the method returns to step S20, and if the cooling water temperature $T_c$ is higher than or equal to 10☐, the outdoor heat exchanger 21 is turned on (S25).

In step S25, it is possible to prevent load, vibration, noise, etc. from being excessively generated in the blowers 22 for the outdoor heat exchanger 21 due to frequent on and off operations of the outdoor heat exchanger 21.

Here, while the first through third reference temperatures $T_{r1}$, $T_{r2}$, and $T_{r3}$ inside the base station 100 can be set to 25☐, 26.5☐ and 27.5☐, it is to be readily understood that the present invention is not limited to these reference temperatures, but instead, the reference temperatures can vary depending upon the communication equipment installed in the base station 100.

Hereafter, operation of the multi-use air conditioner according to the present invention, constructed as mentioned above, will be described in detail.

First, depending upon the indoor temperature $T_{in}$ which is sensed by the indoor temperature sensor 51, as can be readily seen from FIG. 2, when it is necessary to cool the space inside the base station 100 after the operation of the air conditioner according to the present invention is controlled, the cooling water stored in the storage tank 11 is introduced into the indoor heat exchanger 13 by the circulation pumps 12, exchanges heat with indoor air, and decreases the temperature inside the base station 100 to a desired temperature.

Then, the cooling water, which has exchanged heat in the indoor heat exchanger 13 and has absorbed heat existing inside the base station 100, flows through the outdoor heat exchanger 21. At this time, by comparing the outdoor temperature $T_{out}$ and the cooling water temperature $T_c$ measured by the outdoor temperature sensor 52 and the cooling water temperature sensor 53 with reference temperatures as shown in FIG. 3, whether the outdoor heat exchanger 21 is to be operated or not is determined. According to this determination, the cooling water can exchange heat with the naturally cold air in the outdoor heat exchanger 21 to be cooled to a desired temperature or can be bypassed to the first and second cooling units 30 and 40 without exchanging heat in the outdoor heat exchanger 21.

As the cooling water bypassed in this way flows through the heat exchangers 34 and 44 of the cooling units 30 and 40, as shown in FIG. 2, depending upon the indoor temperature $T_{in}$, whether the cooling units 30 and 40 are to be operated or not is determined. According to this determination, the cooling water can exchange heat in the heat exchangers 34 and 44 of the cooling units 30 and 40 to be cooled to a desired temperature or can be bypassed to the storage tank 10 without exchanging heat in the cooling units 30 and 40.

The cooling water which has flowed through the cooling units 30 and 40 is stored again in the storage tank 11, and is then supplied to the indoor heat exchanger 13 by the circulation pumps 12 to exchange heat with the indoor air of the base station 100 in the indoor heat exchanger 13 to thereby cool the inside of the base station 100 to the desired temperature.

Consequently, in the air conditioner for communication equipment and the control method thereof according to the present invention, in order to cool the cooling water having absorbed the heat existing in the inside space of the base station 100 below a desired temperature using the indoor heat exchanger 13, depending upon the indoor and outdoor temperatures and the cooling water temperature, the indoor heat exchanger 13, the outdoor heat exchanger 21 and the pair of cooling units 30 and 40 are selectively operated. Therefore, it is possible to effectively utilize natural cold air and to use the cooling units 30 and 40 only at a minimum level, whereby waste of refrigerant and electric power can be avoided.

Also, in the present invention, a double cooling water circulation structure, in which the pair of circulation pumps 12 are installed in parallel, and a double outdoor heat exchange structure, in which the pair of cooling units 30 and 40 are installed in series on an outdoor portion of the cooling water pipe 15, are adopted, it is possible to reliably maintain the air-conditioned state of the communication equipment.

Although preferred embodiments of the present invention have been described for illustrative purposes, those skilled in the art will appreciate that various modifications, additions and substitutions are possible, without departing from the scope and spirit of the invention as disclosed in the accompanying claim.

The invention claimed is:

1. An air conditioner for communication equipment comprising: an indoor module located inside a base station in which communication equipment is installed, and having a storage tank in which cooling water is stored, a pair of circulation pumps which are installed in parallel on a cooling water pipe extending from an outlet of the storage tank to circulate cooling water in the storage tank, an indoor heat exchanger which is installed on the cooling water pipe extending from outlets of the pair of circulation pumps, and an indoor blower which is positioned adjacent to the indoor heat exchanger; and an outdoor module located outside the base station, and having an outdoor heat exchanger which is installed on the cooling water pipe extending from an outlet of the indoor heat exchanger, an outdoor blower which is positioned adjacent to the outdoor heat exchanger, and a pair of cooling units which are installed in series on the cooling water pipe extending from an outlet of the outdoor heat exchanger, wherein each cooling unit of the outdoor module includes a compressor for compressing a refrigerant used in the cooling unit, a condenser which communicates with the compressor through a refrigerant pipe, a receiver dryer which communicates with the condenser through the refrigerant pipe, a heat exchanger through which a heat exchange tube communicating with the cooling water pipe passes, and an expansion valve which is installed on the refrigerant pipe between the receiver dryer and the heat exchanger.

2. The air conditioner according to claim 1, wherein an indoor temperature sensor is installed inside the base station, an outdoor temperature sensor is installed outside the base station, and a cooling water temperature sensor is installed on the cooling water pipe at a threshold of the outdoor module.

3. A method for controlling the air conditioner for communication equipment according to claim 2, divided into a method for controlling the indoor heat exchanger and the cooling units and a method for controlling the outdoor heat exchanger, the method for controlling the indoor heat exchanger and the cooling units comprising: a first step of measuring an indoor temperature using the indoor temperature sensor; a second step of determining whether the indoor temperature is lower than a first reference temperature, and turning off the entire air conditioner when the indoor temperature is lower than the first reference temperature or turning on the indoor heat exchanger when the indoor temperature is higher than or equal to the first reference temperature; a third step of determining whether the indoor temperature is higher than or equal to the first reference temperature and is lower than a second reference temperature, and returning to the first step when the indoor temperature is higher than or equal to the first reference temperature and is lower than a second reference temperature or turning on one of the first and second cooling units and the indoor heat exchanger when the indoor temperature is higher than or equal to the second reference temperature; a fourth step of determining whether the indoor temperature is higher than or equal to the second reference temperature and is lower than a third reference temperature, and returning to the first step when the indoor temperature is higher than or equal to the second reference temperature and is lower than the third reference temperature; a fifth step of turning on both first and second cooling units and the indoor heat exchanger when the indoor temperature is higher than or equal to the third reference temperature; and a sixth step of determining whether the indoor temperature is lower than the third reference temperature, and returning to the first step when the indoor temperature is lower than the third reference temperature or returning to the fifth step when the indoor temperature is higher than or equal to the third reference temperature, and the method for controlling the outdoor heat exchanger comprising: a first step of separately measuring an outdoor temperature and a cooling water temperature respectively using the outdoor temperature sensor and the cooling water temperature sensor; a second step of determining whether the outdoor temperature is lower than the cooling water temperature; a third step of turning on the outdoor heat exchanger when the outdoor temperature is lower than the cooling water temperature; and a fourth step of turning off the outdoor heat exchanger when the outdoor temperature is higher than or equal to the cooling water temperature.

4. The method according to claim 3, wherein the method for controlling the outdoor heat exchanger further comprises the step of: after the second step, determining whether the cooling water temperature is lower than 5°C, and turning off the outdoor heat exchanger when the cooling water temperature is lower than 5°C or turning on the outdoor heat exchanger when the cooling water temperature is higher than or equal to 5°C.

5. The method according to claim 3, wherein the method for controlling the outdoor heat exchanger further comprises the step of: after the second step, determining whether the cooling water temperature is lower than 5°C, and turning off the outdoor heat exchanger when the cooling water temperature is lower than 5°C, returning to the first step of the corresponding method when the cooling water temperature is higher than or equal to 5°C and is lower than 10°C, or turning on the outdoor heat exchanger when the cooling water temperature is higher than or equal to 10°C.

6. A method for controlling the air conditioner for communication equipment according to claim 1, divided into a method for controlling the indoor heat exchanger and the cooling units and a method for controlling the outdoor heat exchanger, the method for controlling the indoor heat exchanger and the cooling units comprising: a first step of measuring an indoor temperature using the indoor temperature sensor; a second step of determining whether the indoor temperature is lower than a first reference temperature, and turning off the entire air conditioner when the indoor temperature is lower than the first reference temperature or turning on the indoor heat exchanger when the indoor temperature is higher than or equal to the first reference temperature; a third step of determining whether the indoor temperature is higher than or equal to the first reference temperature and is lower than a second reference temperature, and returning to the first step when the indoor temperature is higher than or equal to the first reference temperature and is lower than a second reference temperature or turning on one of the first and second cooling units and the indoor heat exchanger when the indoor temperature is higher than or equal to the second reference temperature; a fourth step of determining whether the indoor temperature is higher than or equal to the second reference temperature and is lower than a third reference temperature, and returning to the first step when the indoor temperature is higher than or equal to the second reference temperature and is lower than the third reference temperature;

a fifth step of turning on both first and second cooling units and the indoor heat exchanger when the indoor temperature is higher than or equal to the third reference temperature; and a sixth step of determining whether the indoor temperature is lower than the third reference temperature, and returning to the first step when the indoor temperature is lower than the third reference temperature or returning to the fifth step when the indoor temperature is higher than or equal to the third reference temperature, and the method for controlling the outdoor heat exchanger comprising: a first step of separately measuring an outdoor temperature and a cooling water temperature respectively using the outdoor temperature sensor and the cooling water temperature sensor; a second step of determining whether the outdoor temperature is lower than the cooling water temperature; a third step of turning on the outdoor heat exchanger when the outdoor temperature is lower than the cooling water temperature; and a fourth step of turning off the outdoor heat exchanger when the outdoor temperature is higher than or equal to the cooling water temperature.

7. The method according to claim 6, wherein the method for controlling the outdoor heat exchanger further comprises the step of: after the second step, determining whether the cooling water temperature is lower than 5<0>C, and turning off the outdoor heat exchanger when the cooling water temperature is lower than 5<0>C or turning on the outdoor heat exchanger when the cooling water temperature is higher than or equal to 5<0>C.

* * * * *